(12) United States Patent
Mizuhara et al.

(10) Patent No.: US 8,344,522 B2
(45) Date of Patent: Jan. 1, 2013

(54) SOLDER STRUCTURE, METHOD FOR FORMING THE SOLDER STRUCTURE, AND SEMICONDUCTOR MODULE INCLUDING THE SOLDER STRUCTURE

(75) Inventors: Hideki Mizuhara, Moriguchi (JP);
Hajime Kobayashi, Moriguchi (JP);
Toshiya Shimizu, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 28 days.

(21) Appl. No.: 12/935,864

(22) PCT Filed: Mar. 18, 2009

(86) PCT No.: PCT/JP2009/055318
§ 371 (c)(1),
(2), (4) Date: Dec. 21, 2010

(87) PCT Pub. No.: WO2009/122912
PCT Pub. Date: Oct. 8, 2009

(65) Prior Publication Data
US 2011/0127669 A1 Jun. 2, 2011

(30) Foreign Application Priority Data
Mar. 31, 2008 (JP) ................. 2008-092111

(51) Int. Cl.
*H01L 23/52* (2006.01)
*H01L 23/48* (2006.01)
*H01L 29/40* (2006.01)

(52) U.S. Cl. .............. 257/780; 257/E23.01; 257/778; 228/180.22; 438/612

(58) Field of Classification Search ............. 257/E23.01, 257/E23.068, 737, 772, 778, 780, 781, 779; 228/180.22, 124.6, 214, 245, 205, 256; 174/126.2; 438/108, 109, 612–614
See application file for complete search history.

(56) References Cited

U.S. PATENT DOCUMENTS 5,205,461 A * 4/1993 Bickford et al. .............. 228/220
5,477,087 A * 12/1995 Kawakita et al. ............. 257/737
5,736,074 A * 4/1998 Hayes et al. ...................... 264/6
(Continued)

FOREIGN PATENT DOCUMENTS
JP 63-285943 11/1988
(Continued)

OTHER PUBLICATIONS

Internatioanl Search Report issued in International Application No. PCT/JP/2009/055318 dated May 19, 2009.
International Preliminary Examination Report on Patentability (I) with an English translation thereof, issued in International Application No. PCT/JP2009/055318 dated Oct. 14, 2010.

*Primary Examiner* — Chris Chu
(74) *Attorney, Agent, or Firm* — McDermott Will & Emery LLP

(57) ABSTRACT

The invention provides a solder structure which is least likely to develop Sn whiskers and a method for forming such a solder structure. The solder structure includes an Sn alloy capable of a solid-liquid coexistent state and an Au (or Au alloy) coating covering at least part of the surface of the Sn alloy. The Au covering is a film that covers and coats at least part of the surface of the Sn alloy. As a preferable mode, the Au coating forms a netlike structure on the surface of the Sn alloy. The thickness of the Au coating is, for instance, 1 to 5 µm.

4 Claims, 18 Drawing Sheets

U.S. PATENT DOCUMENTS

| | | | |
|---|---|---|---|
| 5,889,326 A * | 3/1999 | Tanaka | 257/737 |
| 6,093,964 A * | 7/2000 | Saitoh | 257/738 |
| 6,281,105 B1 * | 8/2001 | Cotte et al. | 438/612 |
| 6,300,164 B1 * | 10/2001 | Call et al. | 438/108 |
| 6,337,445 B1 * | 1/2002 | Abbott et al. | 174/260 |
| 6,400,018 B2 * | 6/2002 | Clatanoff et al. | 257/737 |
| 6,471,115 B1 * | 10/2002 | Ijuin et al. | 228/180.22 |
| 6,809,020 B2 * | 10/2004 | Sakurai et al. | 438/613 |
| 6,906,427 B2 * | 6/2005 | Tanaka et al. | 257/778 |
| 7,176,506 B2 * | 2/2007 | Beroz et al. | 257/232 |
| 7,268,438 B2 * | 9/2007 | Nishiyama et al. | 257/780 |
| 7,759,804 B2 * | 7/2010 | Kanaoka et al. | 257/781 |
| 7,911,061 B2 * | 3/2011 | Schneegans et al. | 257/762 |

FOREIGN PATENT DOCUMENTS

| | | |
|---|---|---|
| JP | 2000-138334 | 5/2000 |
| JP | 2003-297873 | 10/2003 |
| JP | 2004-342861 | 12/2004 |
| JP | 2007-100148 | 4/2007 |
| JP | 2007-157795 | 6/2007 |
| JP | 2008-021501 | 1/2008 |
| JP | 2006-037227 | 2/2008 |
| JP | 2008-031550 | 2/2008 |

* cited by examiner

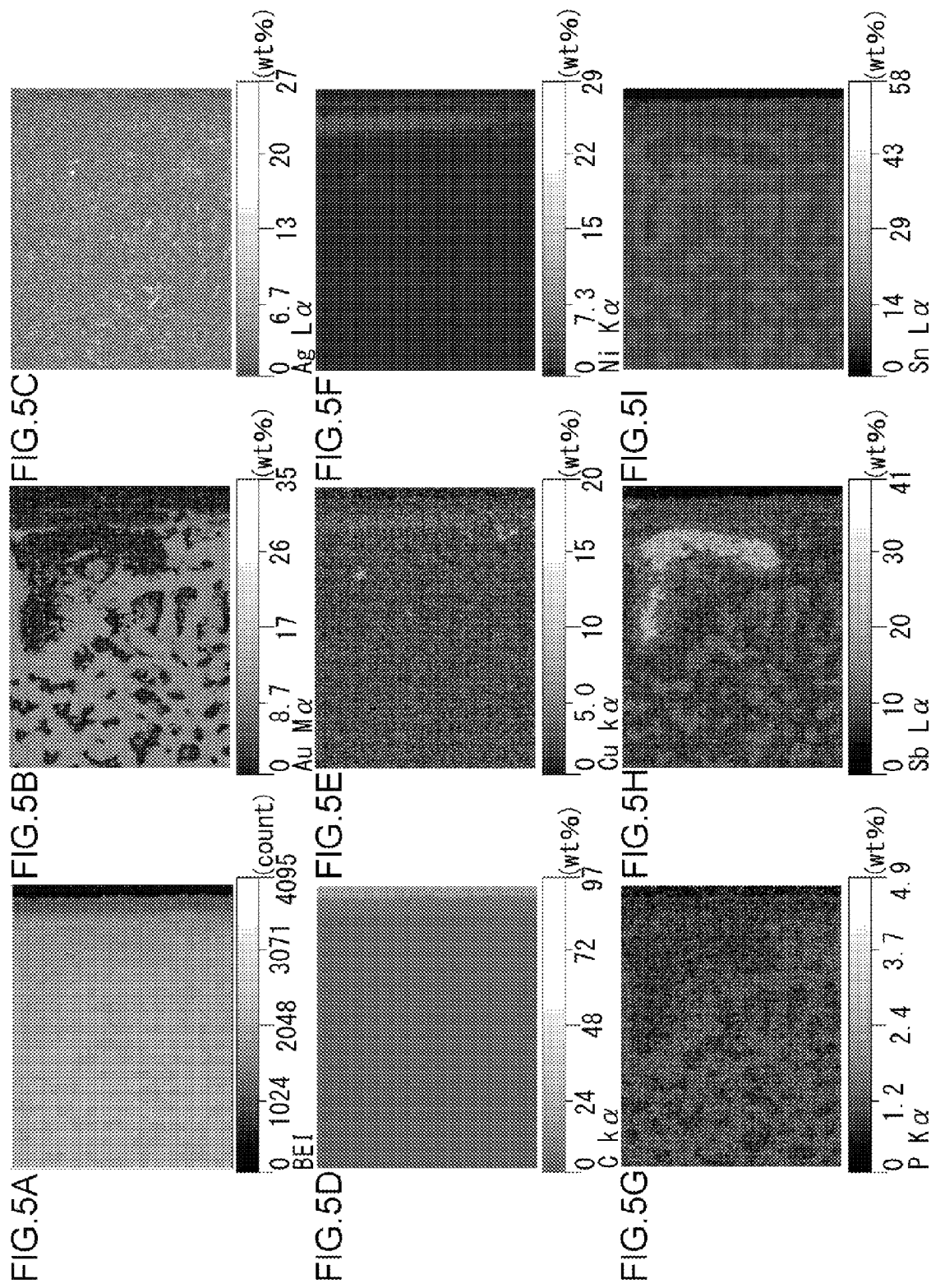

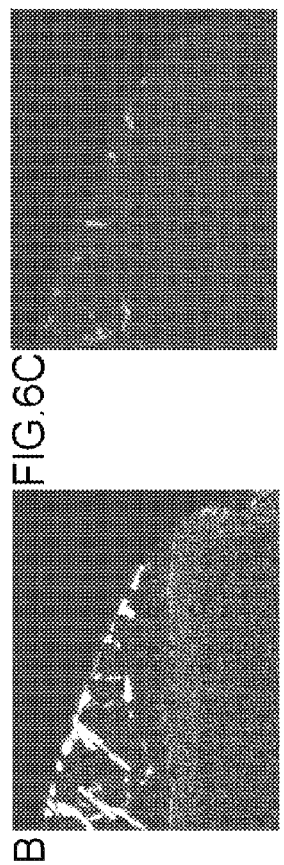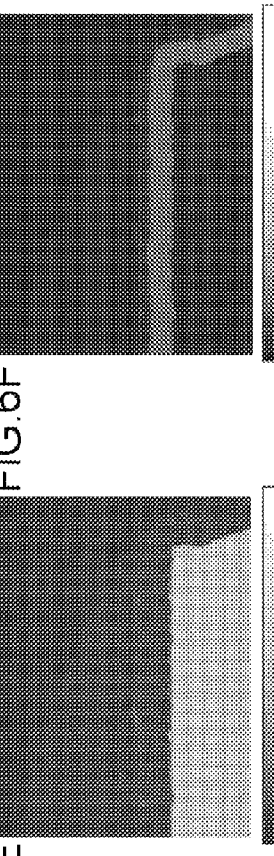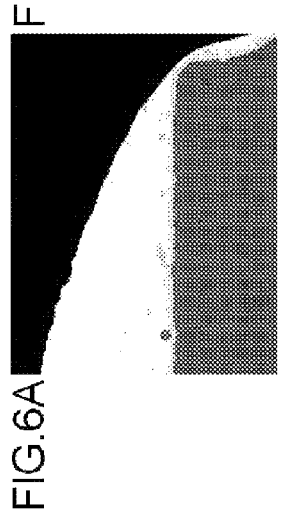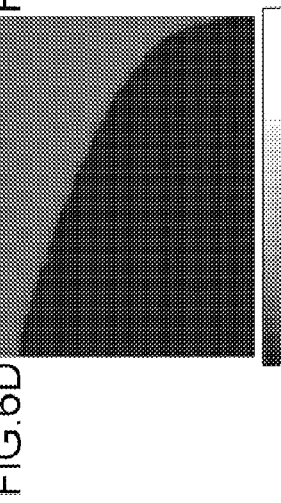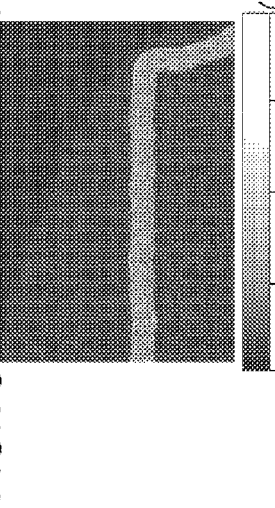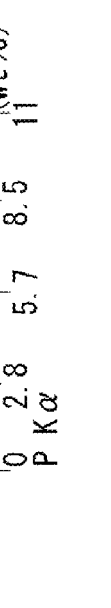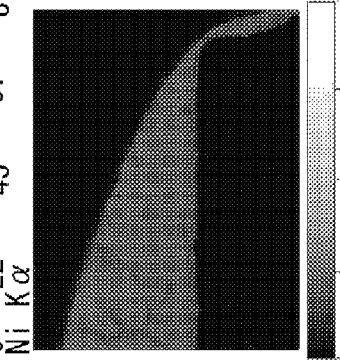
FIG.6A  FIG.6B  FIG.6C
FIG.6D  FIG.6E  FIG.6F
FIG.6G  FIG.6H  FIG.6I

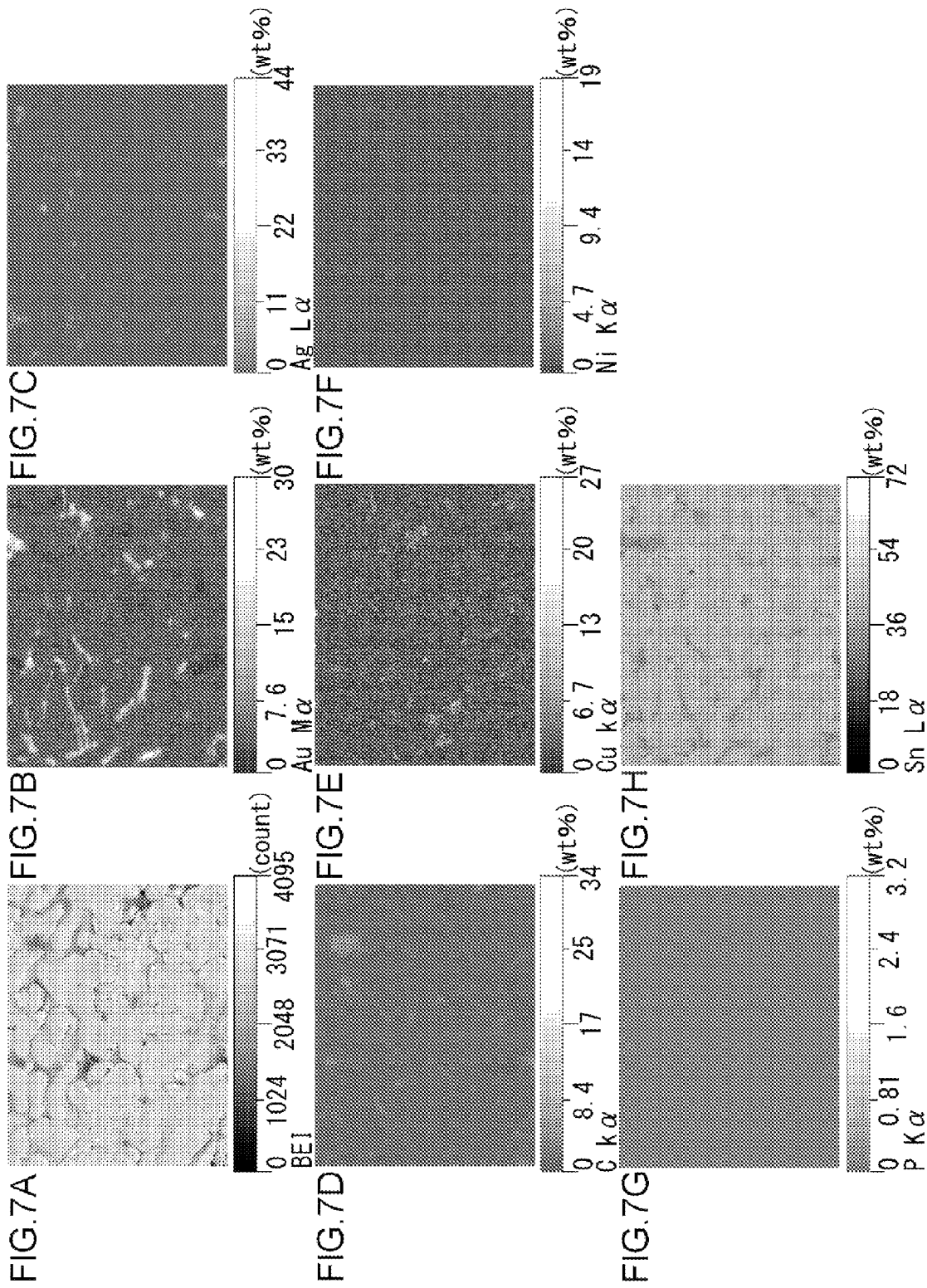

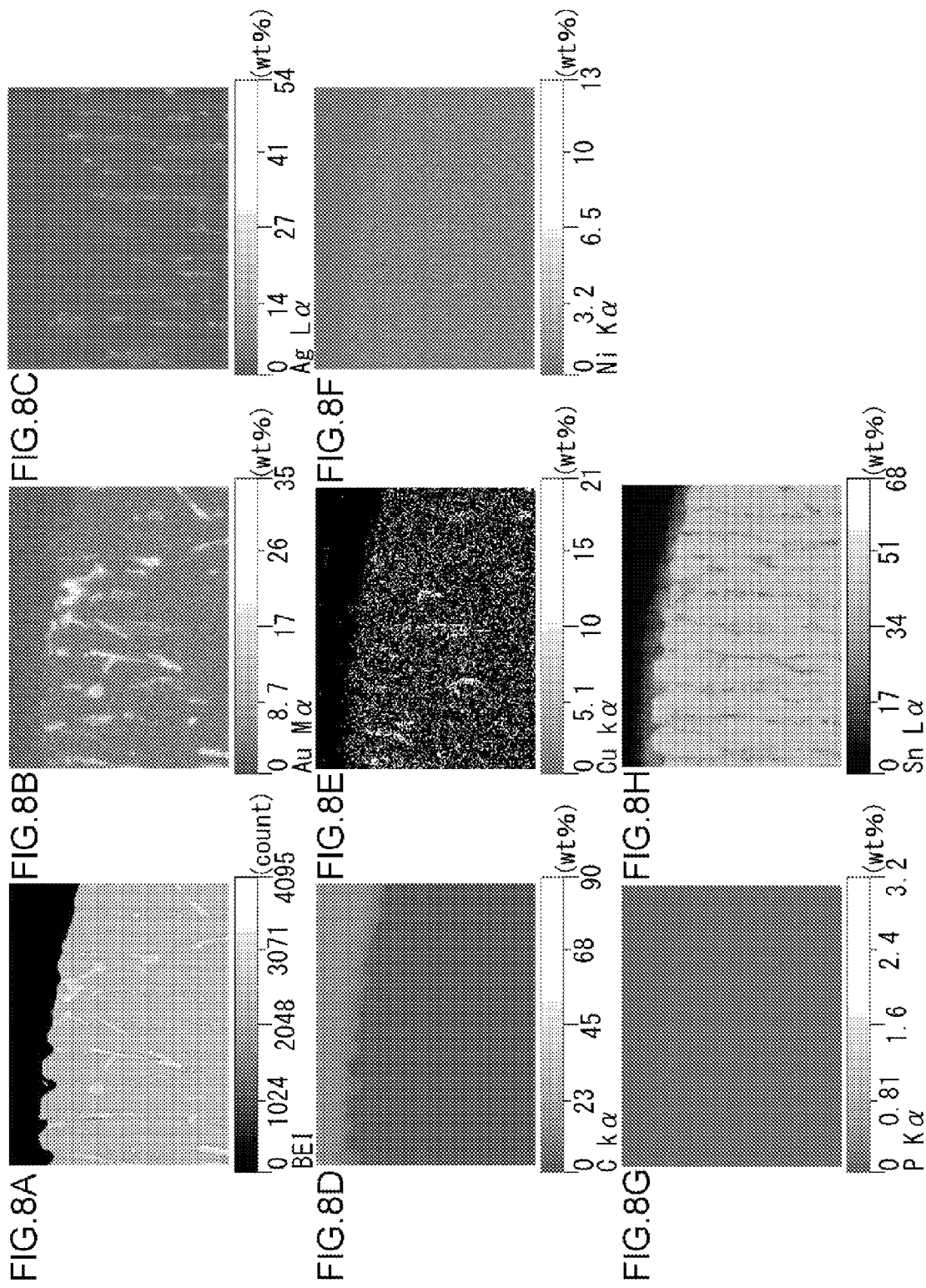

SOLDER STRUCTURE, METHOD FOR FORMING THE SOLDER STRUCTURE, AND SEMICONDUCTOR MODULE INCLUDING THE SOLDER STRUCTURE

RELATED APPLICATIONS

This application is the U.S. National Phase under 35 U.S.C. §371 of International Application No. PCT/JP2009/055318, filed on Mar. 18, 2009, which in turn claims the benefit of Japanese Application No. 2008-092111, filed on Mar. 31, 2008, the disclosures of which Applications are incorporated by reference herein.

TECHNICAL FIELD

The present invention relates to a solder structure containing Sn.

BACKGROUND TECHNOLOGY

Conventionally, solder alloys containing tin (Sn) have been in use as a brazing filler metal. The brazing filler metal joins electronic components or semiconductor devices to the wiring on a substrate. Or the brazing filler connects semiconductor modules, which package semiconductor devices, to a mounting board. In connecting a semiconductor module to the mounting board, a so-called high-temperature solder (high-melting-point solder), which has a melting temperature higher than that of the brazing filler metal for connecting the semiconductor module to the mounting board, is used. This high-temperature solder is used so that electronic components or semiconductor devices within the semiconductor module may not fall off as a result of the melting of the brazing filler metal used in brazing them.

Also, from the viewpoint of reducing the impacts on the environment or the human body, there has been a tendency to avoid the use of SnPb alloys and promote the development of Pb-free Sn alloy solders which do not contain lead (Pb).

[Patent Document 1] Japanese Unexamined Patent Publication No. 2000-138334.

DISCLOSURE OF THE INVENTION

Problems to be Solved by the Invention

A problem with the Sn alloy solder is the occurrence of Sn whiskers (needle-like single crystals), several micrometers to several millimeters long, from Sn alloy solder, which can cause short-circuiting.

The present invention has been made in view of the foregoing problem, and a purpose thereof is to provide an Sn alloy solder which is least likely to develop Sn whiskers and a method for forming such an Sn alloy solder. Another purpose of the present invention is to provide a technology for improving the reliability of semiconductor modules and portable devices that use Sn alloy solder as the brazing filler metal.

Means for Solving the Problems

One embodiment of the present invention relates to a solder structure. The solder structure comprises: an Sn alloy capable of assuming a solid-liquid coexistent state; and an Au or Au alloy coating that covers at least part of a surface of the Sn alloy.

By employing this embodiment, Au or Au alloy that covers and coats the surface of the Sn alloy functions as a barrier, so that the occurrence of whiskers is suppressed. Consequently, where electronic components and the like are connected to the wiring by the use of the solder structure, the occurrence of short-circuiting is suppressed.

In the above-described embodiment, the Au or Au alloy coating may be of a netlike structure.

Another embodiment of the present invention relates to a semiconductor module. The semiconductor module comprises: a wiring substrate; a semiconductor device mounted on the wiring substrate; an electrode disposed on the wiring substrate; an electronic component mounted on the wiring substrate; and a solder structure, having the above-described structure, for electrically connecting the electronic component to the electrode.

Still another embodiment of the present invention relates also to a semiconductor module. The semiconductor module comprises: a device mounting board having an insulating layer, a wiring layer disposed on one of main surfaces of the insulating layer, and a bump electrode, electrically connected to the wiring layer, which protrudes from the wiring layer to an insulating layer side; a semiconductor device provided with a device electrode; and a solder structure having any of the above-described structures, the solder structure electrically connecting the device electrode to the bump electrode.

Still another embodiment of the present invention relates to a portable device. The portable device is such that it mounts a semiconductor module having any of the above-described structures.

Still another embodiment of the present invention relates to a method for forming a solder structure. The method for forming a solder structure comprises: placing an Sn alloy capable of assuming a solid-liquid coexistent state on an Au layer; heating the Sn alloy to a temperature higher than a solidus temperature and lower than a liquidus temperature so as to have the Sn alloy assume a solid-liquid coexistent state, and dissolving Au from the Au layer into the Sn alloy in the solid-liquid coexistent state; and cooling the Sn alloy to cause a crystal growth of Sn and forming an Au or Au alloy coating on at least part of a surface of solidified Sn alloy.

In this embodiment, the cooling of the Sn alloy may be caused to progress from an Au layer side.

Effect of the Invention

The present invention suppresses the occurrence of Sn whiskers in the Sn alloy solder.

BEST MODE FOR CARRYING OUT THE INVENTION

Hereinbelow, the embodiments will be described with reference to the accompanying drawings. Note that the identical components are given the identical reference numerals in all accompanying Figures and the repeated description thereof will be omitted as appropriate.

FIG. 1A is a schematic illustration of a surface state of a solder structure according to a first embodiment. FIG. 1B is a cross-sectional view of the solder structure taken along line A-A of FIG. 1A. A solder structure 2 is constructed of an Sn alloy 4, which can assume a solid-liquid coexistent state, a state of a solid phase and a liquid phase coexisting with each other, and an Au or Au alloy coating 6 (hereinafter referred to as "Au coating 6" meaning an Au film or an Au alloy film), which covers and coats at least part of the surface of the Sn alloy 4. The Au coating 6 is a film that covers and coats at least part of the surface of the Sn alloy 4. As a preferable mode, the Au coating 6 forms a netlike structure on the surface of the Sn alloy 4. The thickness of the Au coating 6 is, for instance, 1 to 5 μm. Also, the examples of Au alloy that can be cited may be Au—Sn, Au—Sn—Sb, Au—Sb, and Au—Sn—Sb—Ag.

The Sn alloy is not restricted to any particular kind but may be any so long as it can form a solid-liquid coexistent state. However, the Sn—Sb-based alloy, Sn—Cu-based alloy, Sn—In-based alloy, Sn—Ag-based alloy, Sn—Ag—Cu-based alloy, Sn—Ag—Bi-based alloy, and Sn—Sb—Ag—Cu-based alloy may be ones that can be cited as examples. Table 1 shows the concrete compositions of those alloy types and their solidus temperatures and liquidus temperatures. It is to be noted that Au may be contained in the Sn alloy. Also, an appropriate amount of flux may be contained in the Sn alloy.

TABLE 1

| | | Melting temperature (° C.) | |
|---|---|---|---|
| | Composition | Solidus | Liquidus |
| Sn—Sb-based | Sn95Sb5 | 232 | 240 |
| | Sn91.5Sb8.5 | 232 | 245 |
| Sn—Cu-based | Sn99Cu1 | 230 | 240 |
| | Sn97Cu43 | 230 | 250 |
| Sn—In-based | Sn95In5 | 310 | 314 |
| | Sn75In25 | 250 | 264 |
| | Sn50In50 | 180 | 209 |
| | Sn25In75 | 156 | 175 |
| Sn—Ag-based | Sn97Ag3 | 221 | 230 |
| | Sn95Ag5 | 221 | 250 |
| Sn—Ag—Bi-based | Sn94Ag3Bi3 | 211 | 219 |
| Sn—Sb—Ag—Cu-based | Sn84.5Sb14Ag1Cu0.5 | 238 | 288 |
| | Sn86.5Sb12Ag1Cu0.5 | 235 | 275 |

With the solder structure 2 according to the present embodiment, an Au layer covering the surface of the Sn alloy 4 performs the role of a barrier, thereby preventing the occurrence of Sn whiskers.

(Method for Forming a Solder Structure)

A method for forming a solder structure according to the first embodiment will be discussed with reference to FIG. 2.

First, as shown in FIG. 2A, an Sn alloy 4 is placed on an Au layer 8. The Au layer 8 is formed, for instance, by electroless plating or electrolytic plating. The Sn alloy 4 to be used is an Sn alloy that can assume a solid-liquid coexistent state, such as those shown in Table 1.

Next, as shown in FIG. 2B, the Sn alloy 4 and the Au layer 8 are heated to a temperature higher than the solidus temperature and lower than the liquidus temperature, to have the Sn alloy 4 assume a solid-liquid coexistent state. At this time, part of the Au constituting the Au layer 8 is dissolved into the Sn alloy 4 in the solid-liquid coexistent state.

Then, as shown in FIG. 2C, the Sn alloy 4 and the Au layer 8 are cooled with the result that there occur both a crystal growth of Sn contained in the Sn alloy 4 and a solidification of the Sn alloy 4. Along with the crystal growth of Sn, an Au coating 6 is formed on at least part of the surface of the solidified Sn alloy 4.

Through the processes as described above, a solder structure according to the first embodiment can be formed. It is preferable, however, that in the cooling step shown in FIG. 2C, the cooling of the Sn alloy is caused to progress from the Au layer 8 side. As such, the growth of Sn crystal nuclei progresses from the Au layer 8 side (underside), and, along with the growth of Sn crystal nuclei, the Au dissolved in the Sn alloy 4 in a solid-liquid coexistent state gets pushed away toward the surface of the Sn alloy 4, thus making it easier for an Au coating 6 to be formed on the surface of the Sn alloy 4.

Example Embodiment

In an example embodiment, Sn84.5—Sb14—Ag1.0—Cu0.5 (solidus temperature: 233° C., liquidus temperature: 288° C.) was used as the Sn alloy for constructing a solder structure. In forming a solder structure of this example embodiment, a reflow was performed with the Sn alloy placed on an Au layer. FIG. 3 shows a reflow temperature profile used in forming the solder structure of the example embodiment. As shown in FIG. 3, after the temperature was raised (preheating) from 180° C. to 230° C. over a period of about 100 seconds, the temperature was raised above the solidus temperature, and then after temperatures above 250° C. were maintained for about 40 seconds, the temperature was brought down. The peak temperature while the temperatures above 250° C. were maintained was about 275° C.

Comparative Example

In a comparative example, Sn96.5—Ag3—Cu0.5 (eutectic point: 218° C.) having no solid-liquid coexistent state was used as the Sn alloy for constructing a solder structure. In forming a solder structure of this comparative example, a reflow was performed with the Sn alloy placed on an Au layer. FIG. 4 shows a reflow temperature profile used in forming the solder structure of the comparative example. This reflow temperature profile is one generally used for the reflow of Sn96.5—Ag3—Cu0.5. As shown in FIG. 4, after the temperature was raised (preheating) from 180° C. to 200° C. over a period of about 80 seconds, the temperature was raised above the eutectic temperature of 218° C., and then after temperatures above 265° C. were maintained for about 50 seconds, the temperature was brought down. The peak temperature while the temperatures above 265° C. were maintained was about 285° C. As for the cooling method, cooled air may be blown to the back side of the board or the temperature may be brought down with the solder structure placed in contact with a cooled solid body (e.g., a stage). With the comparative example, therefore, the Sn alloy constituting the solder structure has a eutectic point but not a solid-liquid coexistent state, so that raising the reflow temperature may cause the melting of the Sn alloy but no deposition of Au coating or Au alloy coating on the surface thereof.

Elemental mapping of each of the solder structures of the example embodiment and the comparative example was carried out using an EPMA (Electron Probe MicroAnalyzer).

FIG. 5A is a backscattered electron image (BEI) on the surface of the solder structure of the example embodiment, whereas FIGS. 5B to 5I are elemental mapping images on the surface of the solder structure of the example embodiment.

[Characteristic X-Rays Detected by EPMA]

FIG. 5B: Au Mα line, FIG. 5C: Ag Lα line, FIG. 5D: C Kα line, FIG. 5E: Cu Kα line, FIG. 5F: Ni Kα line, FIG. 5G: P Kα line, FIG. 5H: Sb Lα line, FIG. 5I: Sn Lα line.

FIG. 6A is a backscattered electron image (BEI) on the cross section of the solder structure of the example embodiment, whereas FIGS. 6B to 6I are elemental mapping images on the cross section of the solder structure of the example embodiment.

[Characteristic X-Rays Detected by EPMA]

FIG. 6B: Au Mα line, FIG. 6C: Ag Lα line, FIG. 6D: C Kα line, FIG. 6E: Cu Kα line, FIG. 6F: Ni Kα line, FIG. 6G: P Kα line, FIG. 6H: Sb Lα line, FIG. 6I: Sn Lα line.

Also, FIG. 7A is a backscattered electron image (BEI) on the surface of the solder structure of the comparative example, whereas FIGS. 7B to 7H are elemental mapping images on the surface of the solder structure of the comparative example.

[Characteristic X-Rays Detected by EPMA]

FIG. 7B: Au Mα line, FIG. 7C: Ag Lα line, FIG. 7D: C Kα line, FIG. 7E: Cu Kα line, FIG. 7F: Ni Kα line, FIG. 7G: P Kα line, FIG. 7H: Sb Lα line.

FIG. 8A is a backscattered electron image (BEI) on the cross section of the solder structure of the comparative example, whereas FIGS. 8B to 8H are elemental mapping images on the cross section of the solder structure of the comparative example.

[Characteristic X-Rays Detected by EPMA]

FIG. 8B: Au Mα line, FIG. 8C: Ag Lα line, FIG. 8D: C Kα line, FIG. 8E: Cu Kα line, FIG. 8F: Ni Kα line, FIG. 8G: P Kα line, FIG. 8H: Sn Lα line.

As is evident from FIGS. 5A to 5I and FIGS. 6A to 6I, the solder structure of the example embodiment has an Au coating of a netlike (network) structure formed on the surface of the Sn alloy. Also, it can be seen that Sn crystal grains of several to several tens of micrometers in size are formed inside the Sn alloy with a segregation of Au in the gaps of the Sn crystal grains. Also, an elemental analysis revealed that the content of Au in the whole of the Sn alloy is 10 to 20 at %. In contrast to this, as shown in FIGS. 7A to 7H and FIGS. 8A to 8H, the solder structure of the comparative example has the presence of Au mainly inside the Sn alloy, unevenly distributed in the gaps of the Sn crystal grains. With the solder structure of the example embodiment, the nucleus growth of Sn occurs more readily in the cooling process, and this causes the Au dissolved in the Sn alloy in a solid-liquid coexistent state to be pushed away by the Sn crystals with the result that an Au or Au alloy coating is formed on the surface of the Sn alloy.

Second Embodiment

FIG. 9 is a cross-sectional view showing a structure of a semiconductor module according to a second embodiment. The semiconductor module 10 includes a device mounting board 20 and a semiconductor device 30, and passive devices 40. The semiconductor device 30 and the passive devices 40 are examples of "electronic components".

The device mounting board 20 includes an insulating layer 22, a wiring layer 24, and a wiring layer 26. As shown in FIG. 9, the wiring layer 24 is patterned on the insulating layer 22. Electrode pads 25a and 25b are provided in predetermined positions of the wiring layer 24. The electrode pads 25a and 25b are formed by forming gold plating layers (electrolytic Au/Ni plating films) 29a and 29b thereon, respectively. Also, insulating resin layers 35 having openings corresponding to the electrode pads 25a and 25b are so formed as to cover the insulating layer 22 and the wiring layer 24.

The wiring layer 26 of a predetermined pattern is provided on an underside of the insulating layer 22. The wiring layer 26 is electrically connected to the wiring layer 24 through the medium of a via 28 that penetrates the insulating layer 22. Gold plating layer (electrolytic Au/Ni plating film) 27 is formed on an underside of the wiring layer 26. Further, a solder ball 50 is formed on the gold plating layer 27. On an underside of the insulating layer 22 and the wiring layer 26, an insulating resin layer (photo solder resist) 52 is formed so that the solder balls 50 are exposed. The solder ball 50 is a low-temperature Pb-free solder and, for instance, an Sn—Ag—Cu-based lead-free solder whose melting temperature is 220° C. may be used as the solder ball 50.

The semiconductor device 30 is an active device such as an integrated circuit (IC) and a large-scale integrated circuit (LSI). The semiconductor 30 is mounted on top of the device mounting board 20 through an adhesion layer 31. An electrode pad 32 is provided on the periphery of the top surface of the semiconductor device 30. The electrode pad 32 and the electrode pad 25b are electrically connected to each other via wire 33 such as gold wire.

Examples of passive devices 40 include resistors and capacitors. A passive device 40 is connected to the electrode pad 25a through a solder structure 100. A high-temperature solder alloy, as described in the first embodiment, where an Au covering is formed on the surface of an Sn alloy is used as the solder structure 100.

The semiconductor device 30 and the passive devices 40 mounted on the device mounting board 20 are sealed by a molded resin layer 60.

In the semiconductor module 10 as described above, when the semiconductor module 10 is to be mounted on a printed circuit board and the like by dissolving and solidifying the solder balls in a reflow process, the solder structure 101, which is a high-temperature solder, maintains the solid state and does not dissolve. This prevents the passive device 40 from falling off and therefore the connection reliability of the semiconductor module 10 is improved.

Also, as described in the first embodiment, the high-temperature alloy where the Au covering is formed on the surface of the Sn alloy is used as the solder structure 100. Hence, the occurrence of Sn whiskers is suppressed by the barrier effect of Au covering. As a result, the connection reliability of the semiconductor module 10 is improved.

Though, in the present embodiment, the semiconductor device 30 is wire-bonded to the electrode pad 25b, the semiconductor device 30 may be flip-chip connected thereto instead. In such a case, a high-temperature solder alloy, as described in the first embodiment, where an Au covering is formed on the surface of an Sn alloy is used as the brazing filler metal for flip-chip connecting the semiconductor 30 to the electrode pad 25b and the like.

Third Embodiment

FIG. 10 is a cross-sectional view showing a structure of a semiconductor module according to a third embodiment. The semiconductor module 30 according to the present embodiment includes a device mounting board 210 and a semiconductor device 250 mounted on the device mounting board 210.

The device mounting board 210 includes an insulating resin layer 212, a wiring layer 214 provided on one main surface S1 of the insulating resin layer 212, and a bump electrode 216, electrically connected to the wiring layer 214, which is protruded from the wiring layer 214 toward an insulating resin layer 212 side.

The insulating resin layer 212 is made of insulating resin and is formed of, for example, a material that develops plastic flow when pressurized. An example of the material that develops plastic flow when pressurized is epoxy-based thermosetting resin. The epoxy-based thermosetting resin to be used for the insulating resin layer 212 may be, for example, one having viscosity of 1 kPa·s under the conditions of a temperature of 160° C. and a pressure of 8 MPa. If a pressure of 5 to 15 MPa is applied to this epoxy-based thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg. Also, this epoxy-based thermosetting resin is a dielectric substance having a permittivity of about 3 to 4.

The wiring layer 214 is provided on one main surface S1 of the insulating resin layer 212 and is formed of a conducive material, preferably of a rolled metal or more preferably of a rolled copper. Or the wiring layer 214 may be formed of electrolyte copper or the like. The bump electrode 16 is provided, in a protruding manner, on the insulating resin layer 212 side. In the present embodiment, the wiring layer 214 and the bump electrode 216 are formed integrally with each other, but the structure thereof is not particularly limited thereto.

A protective layer 218, which protects the wiring layer 214 against oxidation or the like, is provided on a main surface of the wiring layer 214 opposite to the insulating resin layer 212. The protective layer 218 may be a photo solder resist layer, for instance. An opening 218a is formed in a predetermined position of the protective layer 218, and the wiring layer 214 is partially exposed in the opening 218a. A solder ball 50, which functions as an external connection electrode, is formed within the opening 218a. And the solder ball 50 and the wiring layer 214 are electrically connected to each other. The position in which the solder ball 20 is formed, namely, the area in which the opening 218a is formed is, for instance, an end where circuit wiring is extended through a rewiring. An Sn—Ag—Cu-based lead-free solder whose melting temperature is 220° C. may be used as the solder ball 50.

The overall shape of the bump electrode 216 is narrower toward the tip portion thereof. In other words, the side surface of the bump electrode 216 is tapered. An Au layer 222 is provided on a top surface 217 of the bump electrode 216. A Ni/Au plating layer is preferable as the Au layer 222.

The semiconductor device 250 is mounted on the device mounting board 210 having the above-described structure so as to form the semiconductor module 10. The semiconductor module 10 according to the present embodiment is structured such that a bump electrode 216 of the device mounting board 210 is electrically connected to a device electrode 252 of the semiconductor device 250.

The semiconductor device 250 has the device electrodes 252 disposed counter to the semiconductor substrate 251 and the bump electrodes 216, respectively. An insulating layer 253 and a device protective layer 254, in which openings are provided so that the device electrodes 252 can be exposed from the openings, are stacked on the main surface of the semiconductor device 250 which is a side in contact with the insulating resin layer 212. A solder structure 101 that electrically connects the bump electrode to the device electrode 252 is provided on the surface of the device electrode 252.

Also, an alignment mark 257 is provided in a predetermined position of the semiconductor substrate 251. An alignment mark 257 may be covered with the insulating layer 253, as in the present embodiment, so long as it is optically visible. In a modification of the present embodiment, the alignment marks 257 may be provided in an opening of the insulating layer 253 and the protective layer 254. Also, an insulating layer 256 is provided on the back side of the semiconductor substrate 251.

A specific example of the semiconductor substrate 251 is a semiconductor chip such as an integrated circuit (IC) or a large-scale integrated circuit (LSI). A specific example of the insulating layer 253 is an epoxy resin film or the like. A specific example of the protective layer 254 is a polyimide layer or the like. For example, aluminum (Al) is used as the device electrode 52. A specific example of the insulating layer 256 is an epoxy resin film.

(Method for Fabricating a Semiconductor Module)

A method for manufacturing a semiconductor device according to the third embodiment is now described.

FIGS. 11A to 11C are cross-sectional views showing a process in a method for forming the semiconductor device.

As illustrated in FIG. 11A, a semiconductor substrate 251 on which a device electrode 252 constituting a part of a device electrode is first prepared. The semiconductor substrate 251 is an Si substrate, for example, on which an integrated circuit (IC) or a large-scale integrated circuit (LSI) is formed. The device electrode 252 can be formed by patterning Al, for instance. An alignment mark 257 is provided in a predetermined position of the semiconductor substrate 251. The alignment mark 257 may be formed simultaneously when Al for use as the device electrode 252 is patterned, for instance. That is, the alignment mark 257 is formed of Al in this case. However, it suffices if the alignment mark 257 is optically visible, and the alignment mark 257 may be formed using other materials or processes.

Then, as shown in FIG. 11B, an insulating layer 253 and a protective layer 254 are so formed as to cover the surface of the semiconductor substrate 251 around the device electrode 252, using a photoresist technique. For example, epoxy resin may be used as the insulating layer 253. For example, polyimide may be used as the protective layer 254. The thickness of SiN film is about 1.5 μm, for instance. Note that a semiconductor substrate 251, as shown in FIG. 11B, on which a device electrode 252, an insulating layer 253 and a protective layer 254 may be prepared instead.

Then, as shown in FIG. 11C, an Sn alloy 101 is formed on the device electrode 252 by using a screen printing method. The Sn alloy 101 is a material selected from among alloys listed in Table 1. Here, the thickness of the Sn alloy 101 is adjusted so that the surface of the Sn alloy 101 lies on the same plane as the surface of the protective layer 254 or the surface of the Sn alloy 101 is protruded against that of the protective surface 254. Thus, the semiconductor device 250 is manufactured through processes as described above.

FIGS. 12A to 12D are cross-sectional views showing a process in a method for forming bump electrodes.

As illustrated in FIG. 12A, a copper sheet 213 is prepared as a metallic sheet having a thickness greater than at least the sum of the height of the bump electrode 216 and the thickness of the wiring layer 214 as shown in FIG. 10. The thickness of the copper sheet 213 is 125 μm, for instance.

Then, as shown in FIG. 12B, resists 270 are formed selectively in alignment with a pattern of bump electrodes 216 using a lithography method. More specifically, a resist film of predetermined film thickness is affixed to the copper sheet 213 by a laminating apparatus, and it is then subjected to exposure using a photo mask having the pattern of bump electrodes 216. After this, the resists 270 are selectively formed on the copper sheet 213 by a development. To improve the adhesion of the resists 270 to the copper sheet 213, it is desirable that a pretreatment, such as grinding and cleaning, be performed as necessary on the surface of the copper sheet 213 before the lamination of the resist film thereon.

Then, as shown in FIG. 12C, bump electrodes 216 having a predetermined pattern are formed on the copper sheet 213 using the resists 270 as a mask.

Then, as shown in FIG. 12D, the resists 270 are removed using a stripping agent. Thus the bump electrodes 216 are formed on the copper sheet 213 through a process as described above. The diameter of the base, the diameter of the top, and the height of the bump electrode 216 according to the present embodiment are 100 to 140 μmφ, 50 μmφ, and 25 to 25 μmφ, respectively, for instance.

FIGS. 13A to 13D are cross-sectional views showing a process in a method for forming metallic layers on the top surfaces of bump electrodes.

As shown in FIG. 13A, a gold-resistant resist 260 is stacked on the copper sheet 213 on a side where the bump electrodes 216 are formed, using the laminating apparatus.

Then, as shown in FIG. 13B, the gold-resistant resist 260 is turned into thin film by the use of $O_2$ plasma etching so that the top surface 17 of the bump electrode 216 is exposed.

Then, as shown in FIG. 13C, an Au layer 222 comprised of a Ni/Au layer is formed on the top surface of the bump electrode 216 by electroless plating. After the formation of the Au layer 222, the gold-resistant resist 260 is removed.

Then, as shown in FIG. 13D, the surface of the copper sheet 213 on a side opposite to the side where the bump electrodes 216 are provided is etched back and the copper sheet 213 is turned into thin film thereby. Then, a recess 262 serving as the alignment mark is formed by etching a predetermined region of the copper sheet 213 using a resist (not shown).

FIGS. 14A and 14B are cross-sectional views showing a process in a method for exposing heads of bump electrodes.

As shown in FIG. 14A, an insulating resin layer 212 is stacked on the surface of the copper sheet 213 on the side where the bump electrodes 216 are provided, using a vacuum laminating method. For example, an epoxy-based thermosetting resin can be used as the insulating resin layer 212.

Then, as shown in FIG. 14B, the insulating resin layer 212 is turned into thin film by the use of $O_2$ plasma etching so that the Au layer 222 provided on the top surface 17 of the bump electrode 16 is exposed. In the present embodiment, Au is exposed as the surface of the Au layer 222.

FIGS. 15A to 15C are cross-sectional views showing a process in a method for pasting together a semiconductor device and a board (device mounting board) on which the semiconductor device and bump electrodes are provided.

As shown in FIG. 15A, the positions of the recess 262 provided in the copper sheet 213 and the alignment mark 257 provided on the semiconductor substrate 251 are adjusted by using an alignment apparatus or the like.

Then, as shown in FIG. 15B, the insulating resin layer 212 and the semiconductor device 250 are temporarily bonded in a central part of the copper sheet 213 which is a region where the recess 262 is provided.

Then, as shown in FIG. 15C, an insulating layer 256 with a copper foil 272 is pasted on the back side of the semiconductor device 250. After this, the insulating resin layer 212 and the semiconductor device 150 are press-bonded to each other, and an Au layer 222 and a device electrode 252 are brazed together by the use of a reflow process. Though the reflow temperature profile used may vary depending on an ally used as the aforementioned Sn alloy 101, the reflow profile shown in FIG. 3 is used if Sn84.5—Sb14—Ag1.0—Cu0.5 is used as the Sn alloy 101.

As a result of the reflow process, part of Au in the Au layer 22 is diffused into the aforementioned Sn alloy 101. Thus, formed is the solder structure 100, as described in the first embodiment, where an Au covering is formed on the surface of the Sn alloy.

Since the insulating layer 256 having the copper foil 272 is pasted on the back side of the semiconductor device 250, the warping of the copper sheet 213 caused by the heating in the reflow process and the cooling thereafter is canceled out by the warping of the copper foil 272. As a result, the occurrence of the warping can be prevented as a whole. It is desirable that the thickness of the copper foil 272 is the same as that of the copper sheet 213.

FIGS. 16A and 16B are cross-sectional views showing a rewiring process.

As shown in FIG. 16A, the copper sheet 213 is selectively removed by using a photolithography method and an etching method so as to form a wiring layer 214 (hereinafter referred to as "rewiring layer" also).

Then, as shown in FIG. 16B, a protective layer (photo solder resist layer) 218 is stacked on the wiring layer 214 and the insulating resin layer 212. After this, openings are provided in predetermined regions (mounting regions of solder balls) of the protective layer 218 by using the photolithography method, and the solder balls 50 are mounted in these openings by using the screen printing method.

Thus, the semiconductor module 10 according to the third embodiment is manufactured through processes as described above. If the above-described processes are to be done at a wafer level, a semiconductor wafer is diced into individual units.

According to the present embodiment, when the semiconductor module 10 is to be mounted on a printed circuit board and the like by dissolving and solidifying the solder balls in a reflow process, the solder structure 101, which is a high-temperature solder, maintains the solid state and does not dissolve. As a result, a desirable state of electrical connection between the Au layer 222 and the device electrode 252 is maintained and therefore the connection reliability of the semiconductor module 10 is improved.

Also, as described in the first embodiment, the high-temperature alloy where the Au covering is formed on the surface of the Sn alloy is used as the solder structure 101. Hence, the occurrence of Sn whiskers is suppressed by the barrier effect of Au covering. As a result, the connection reliability of the semiconductor module 10 is improved.

Fourth Embodiment

Next, a description will be given of a mobile apparatus (portable device) provided with a semiconductor module according to a fourth embodiment. The mobile apparatus presented as an example herein is a mobile phone, but it may be any electronic apparatus, such as a personal digital assistant (PDA), a digital video cameras (DVC) or a digital still camera (DSC).

FIG. 17 illustrates a structure of a mobile phone provided with a semiconductor module according to each of the above-described embodiments of the present invention. A mobile phone 111 has a basic structure of a first casing 112 and a second casing 114 jointed together by a movable part 120. The first casing 112 and the second casing 114 are turnable around the movable part 120 as the axis. The first casing 112 is provided with a display unit 118 for displaying characters, images and other information and a speaker unit 124. The second casing 114 is provided with a control module 122 with operation buttons and a microphone 126. Note that a semiconductor module according to each embodiment of the present invention is mounted within a mobile phone 110 such as this.

FIG. 18 is a partially schematic cross-sectional view (cross-sectional view of the first casing 112) of the mobile phone shown in FIG. 17. A semiconductor module 10 according to any of the preferred embodiments of the present invention is mounted on a printed circuit board 128 via solder balls 50, and is coupled electrically to a display unit 118 and the like by way of the printed circuit board 128. Also, a radiating substrate 116, which may be a metallic substrate or the like, is provided on the back side of the semiconductor module 10 (opposite side of the solder balls 50), so that the heat generated from the semiconductor module 10, for example, can be efficiently released outside the first casing 112 without getting trapped therein.

By employing the semiconductor module 10 according to the embodiments of the present invention, the reliability of mounting the semiconductor module 10 on a printed wiring board improves. Thus, the reliability as to a portable device provided with such a semiconductor module 10 improves.

The present invention has been described by referring to each of the above-described embodiments. However, the present invention is not limited to the above-described embodiments only. It is understood that various modifications such as changes in design may be made based on the knowledge of those skilled in the art, and the embodiments added with such modifications are also within the scope of the present invention.

BRIEF DESCRIPTION OF THE DRAWINGS

FIG. 5A is a backscattered electron image (BEI) on the surface of a solder structure of an example embodiment, whereas FIGS. 5B to 5I are elemental mapping images on the surface of the solder structure of an example embodiment.

FIG. 6A is a backscattered electron image (BEI) on the cross section of a solder structure of an example embodiment, whereas FIGS. 6B to 6I are elemental mapping images on the cross section of the solder structure of an example embodiment.

FIG. 7A is a backscattered electron image (BEI) on the surface of the solder structure of the comparative example, whereas FIGS. 7B to 7H are elemental mapping images on the surface of the solder structure of a comparative example.

FIG. 8A is a reflected electron image (BEI) on the cross section of a solder structure of a comparative example, whereas FIGS. 8B to 8H are elemental mapping images on the cross section of the solder structure of a comparative example.

DESCRIPTION OF THE REFERENCE NUMERALS

Figure 1A:
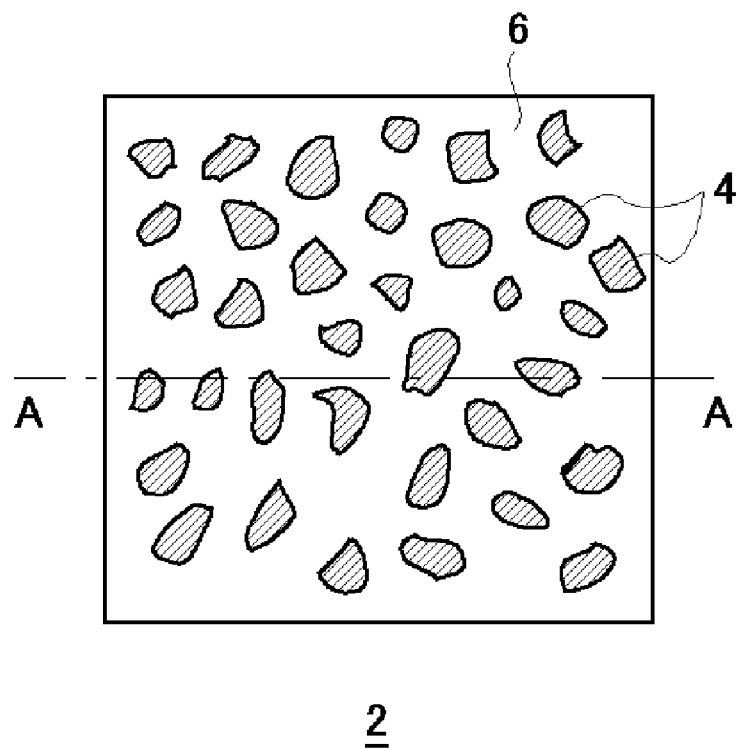
FIG. 1A is a schematic illustration of a surface state of a solder structure according to a first embodiment.
Figure 1B:
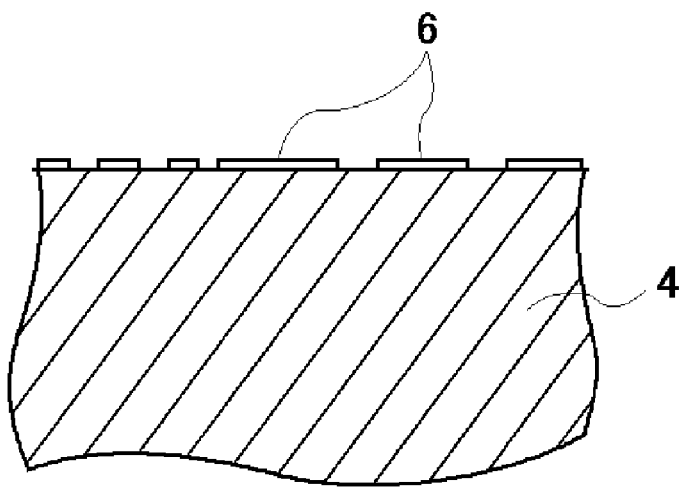
FIG. 1B is a cross-sectional view taken along line A-A of FIG. 1A.
Figure 2A:
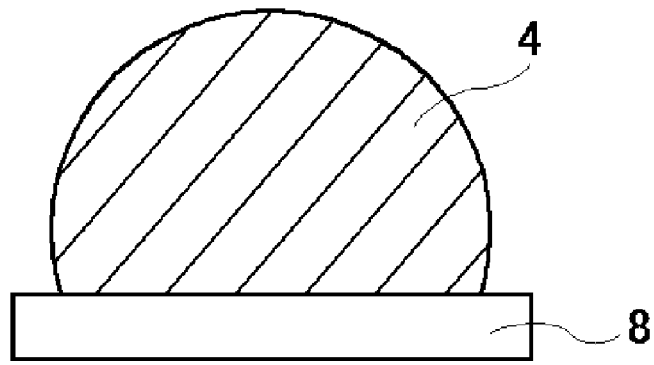
FIGS. 2A to 2C are process charts showing a method for forming a solder structure.
Figure 2B:
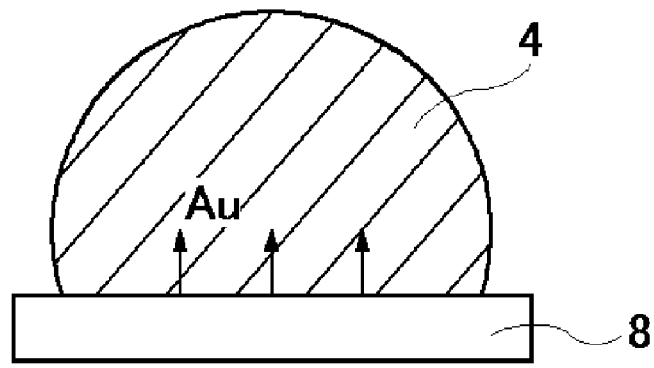
Figure 2C:
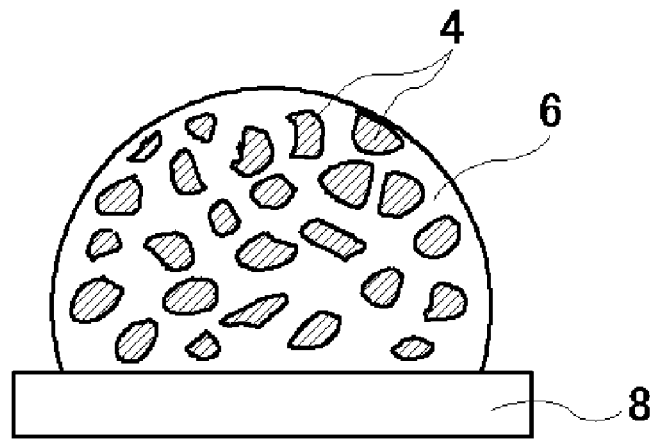
Figure 3:
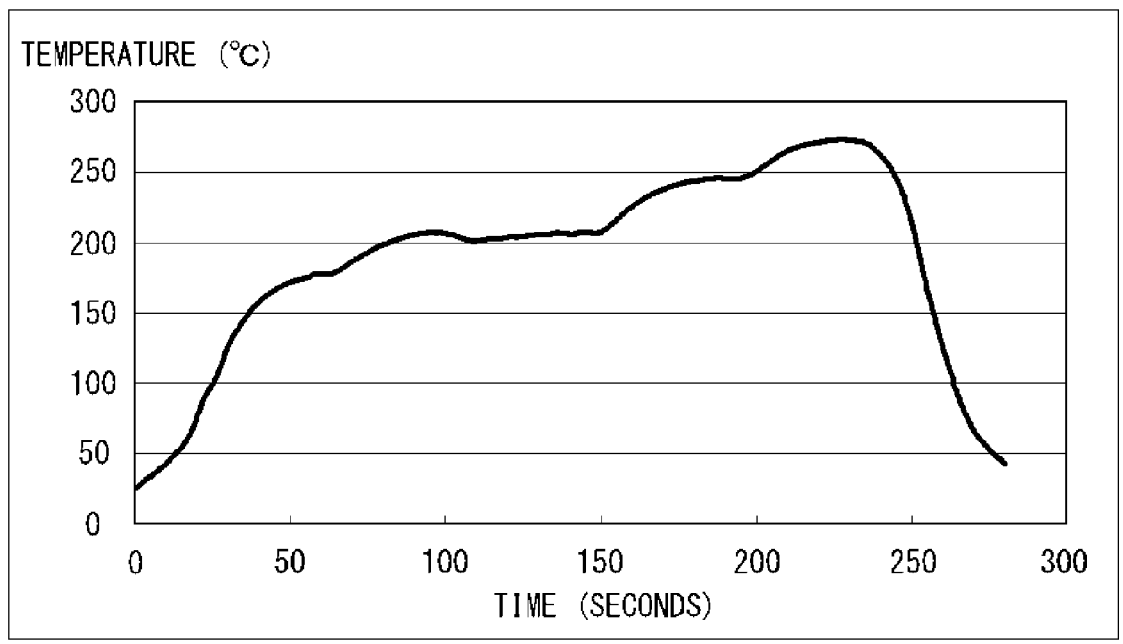
FIG. 3 shows a reflow temperature profile used in forming a solder structure according to an example embodiment.
Figure 4:
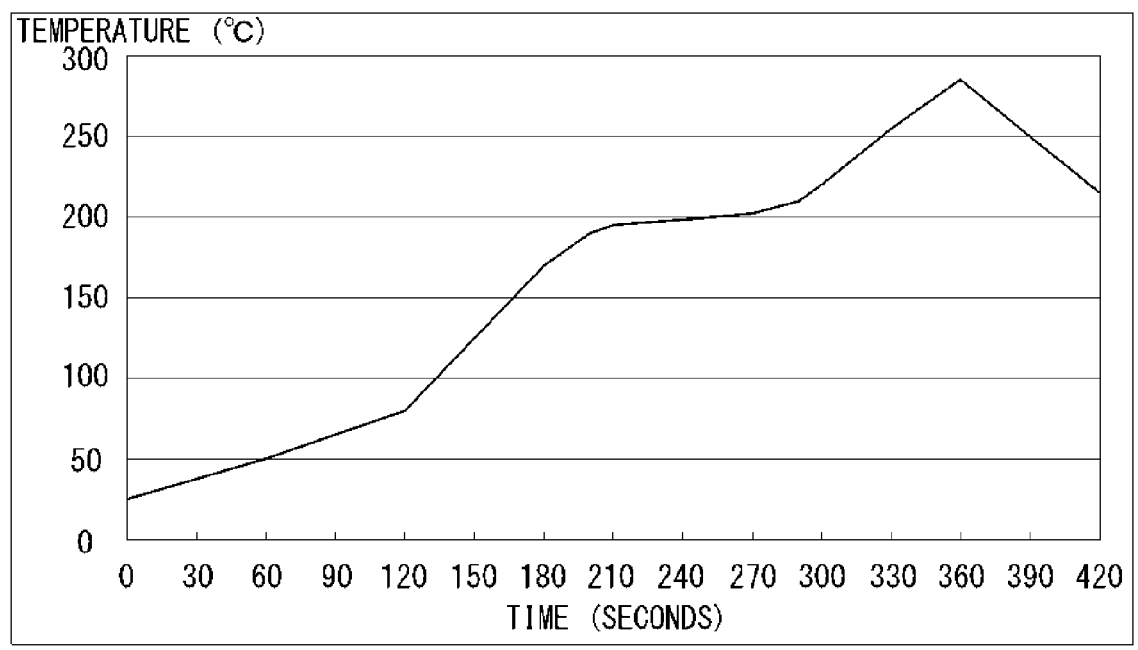
FIG. 4 shows a reflow temperature profile used in forming a solder structure of a comparative example.
Figure 9:
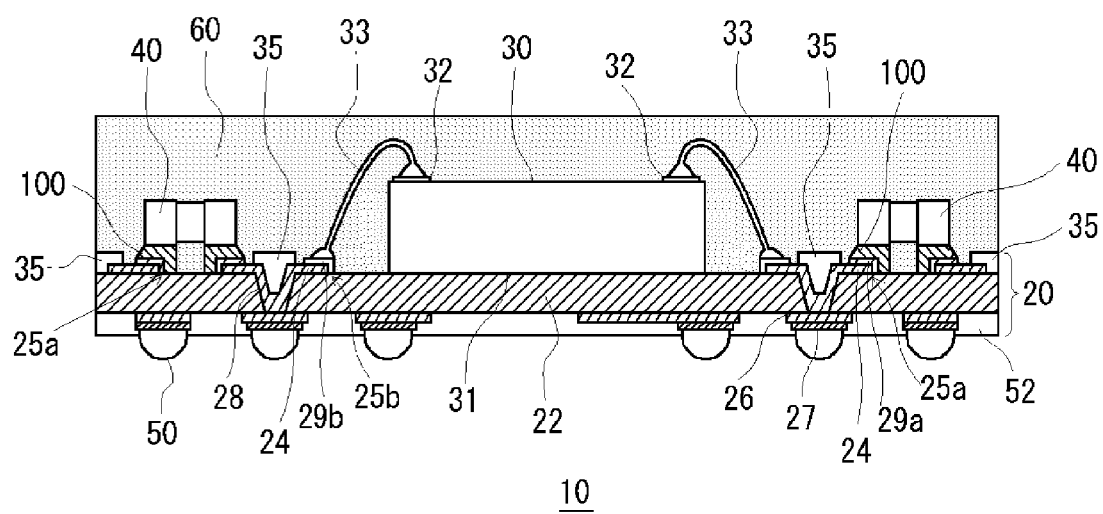
FIG. 9 is a cross-sectional view showing a structure of a semiconductor module according to a second embodiment.
Figure 10:
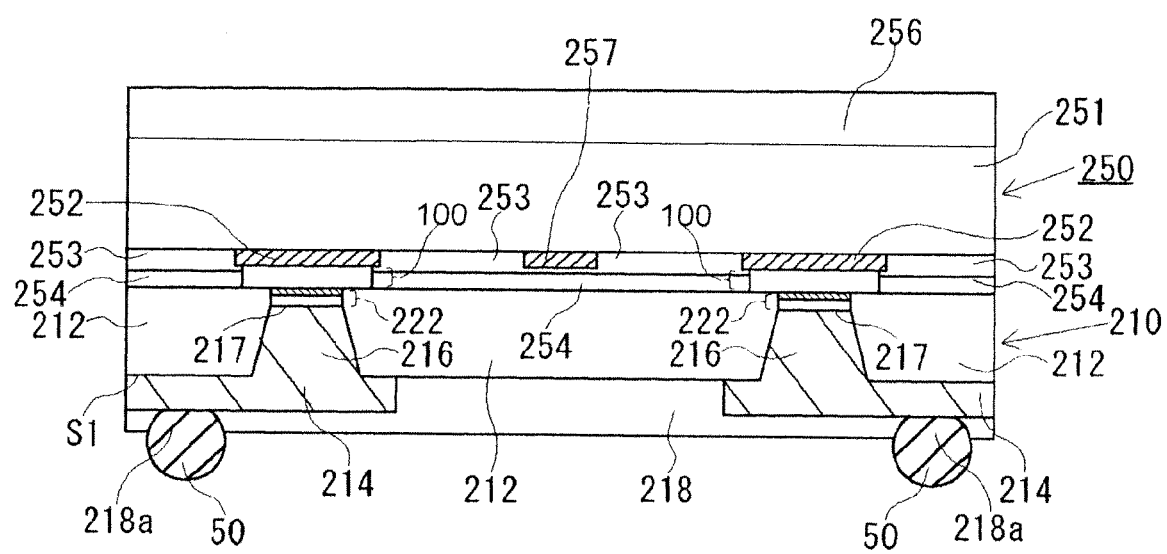
FIG. 10 is a cross-sectional view showing a structure of a semiconductor module according to a third embodiment.
Figure 11A:
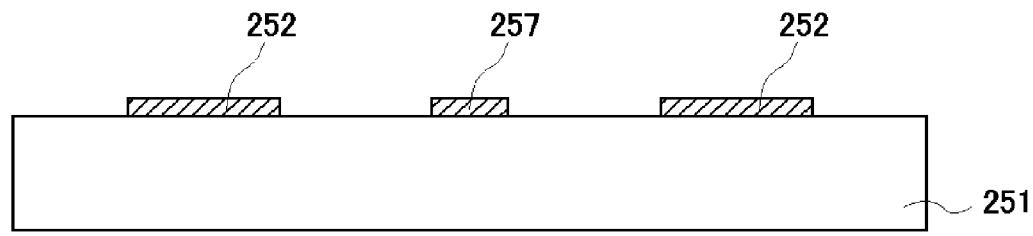
FIGS. 11A to 11C are cross-sectional views showing a process in a method for forming a semiconductor device.
Figure 11B:
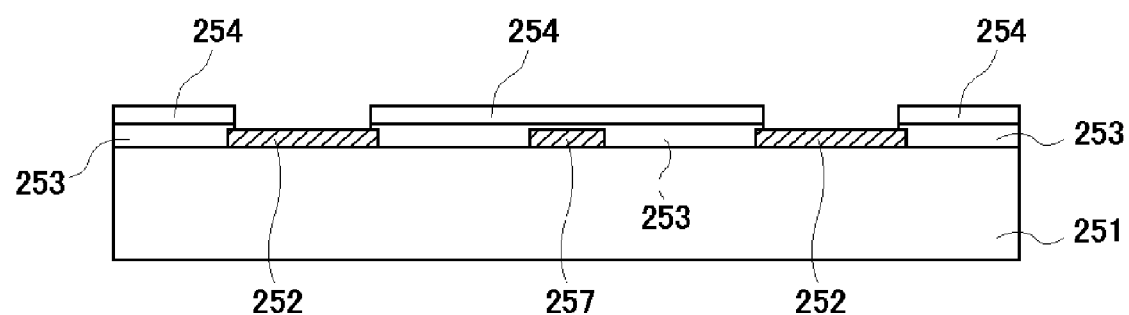
Figure 11C:
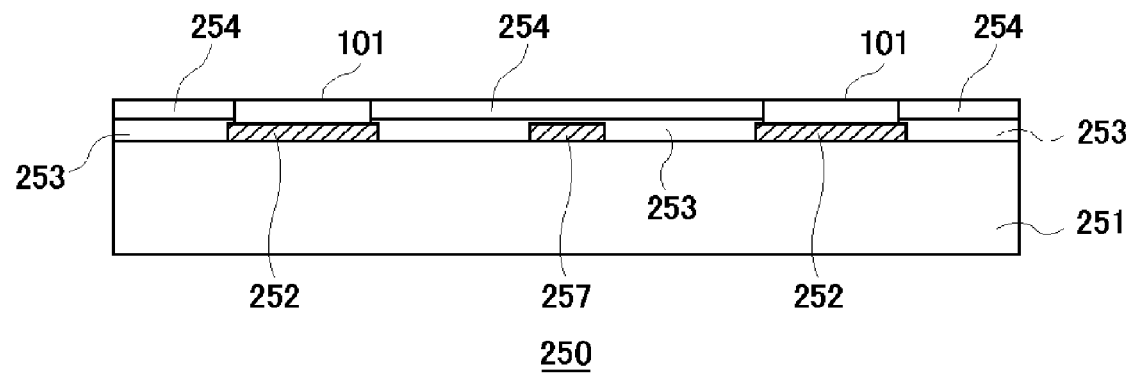
Figure 12A:
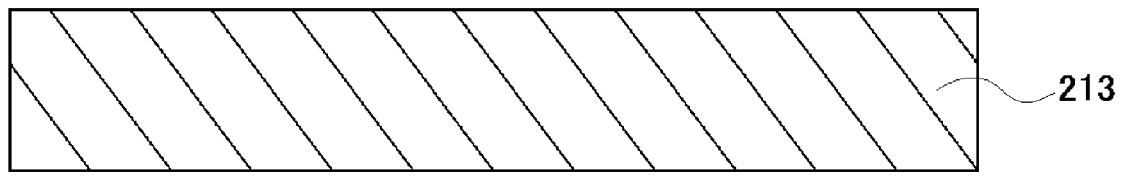
FIGS. 12A to 12D are cross-sectional views showing a process in a method for forming bump electrodes.
Figure 12B:
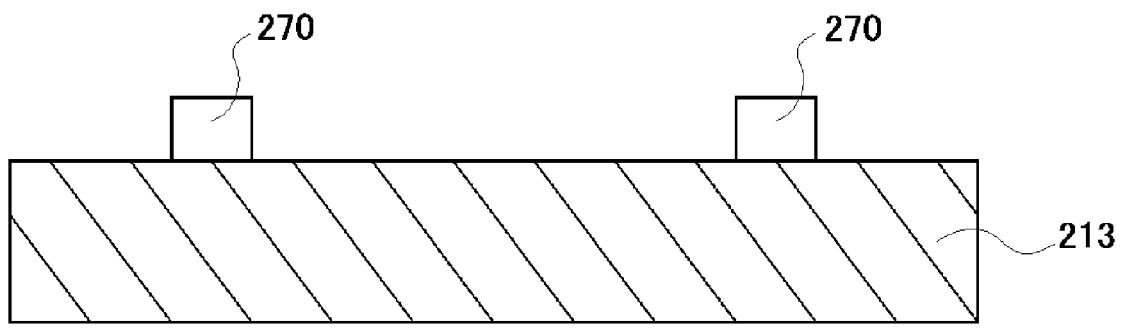
Figure 12C:
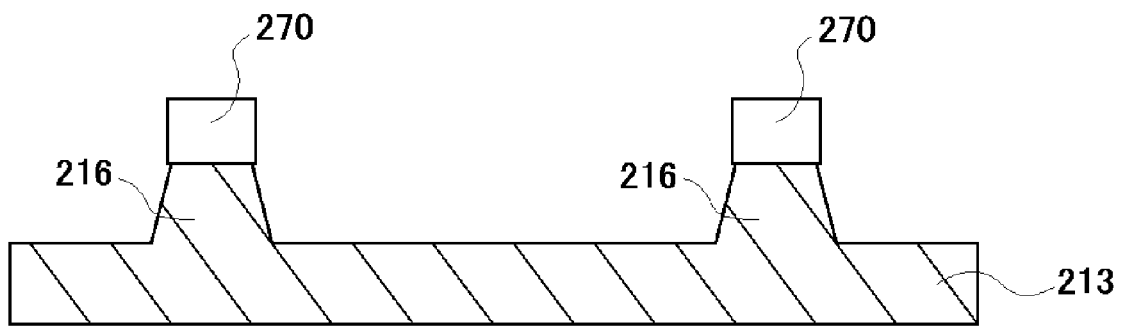
Figure 12D:
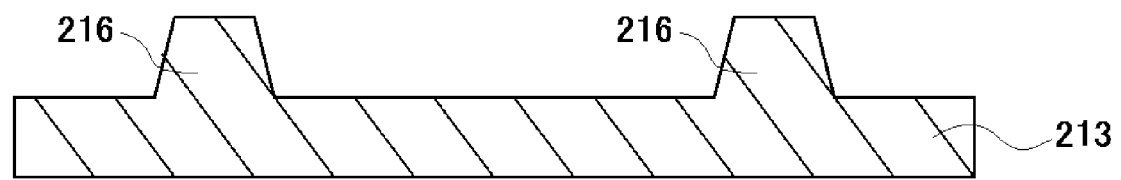
Figure 13A:
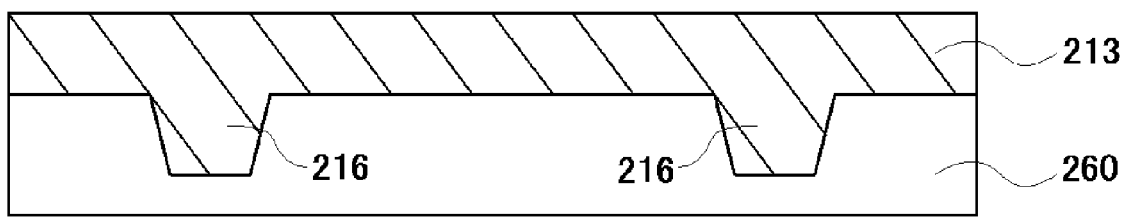
FIGS. 13A to 13D are cross-sectional views showing a process in a method for forming metallic layers on the top surfaces of bump electrodes.
Figure 13B:
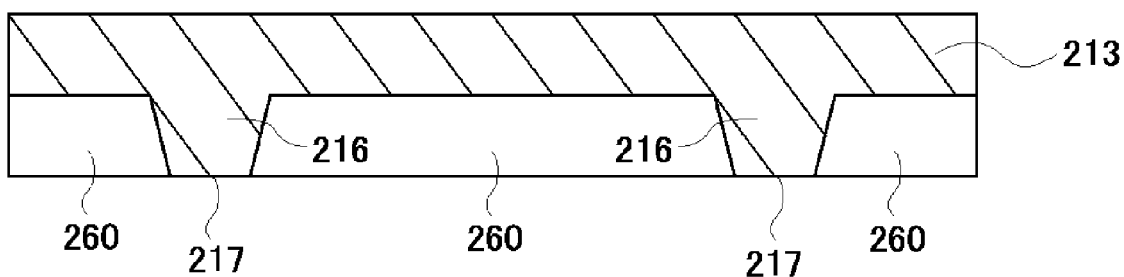
Figure 13C:
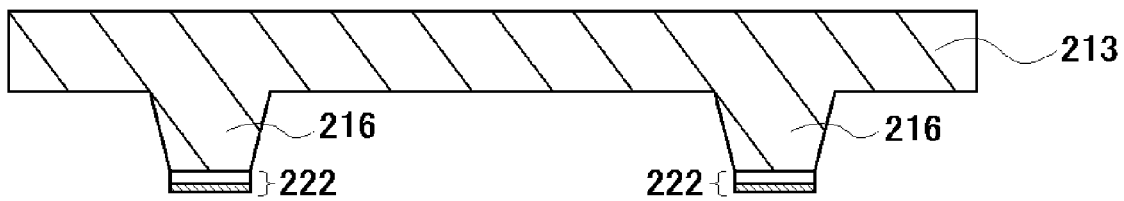
Figure 13D:
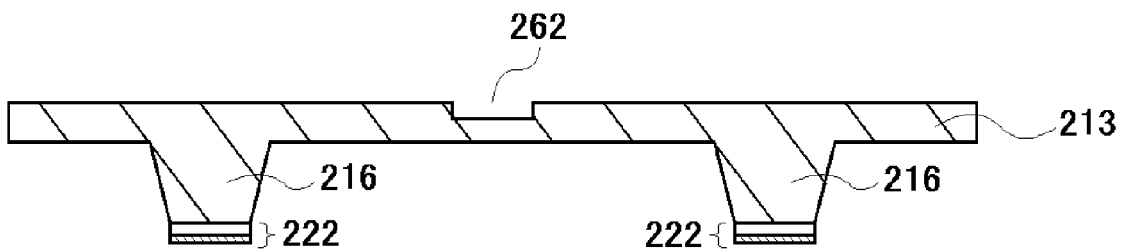
Figure 14A:
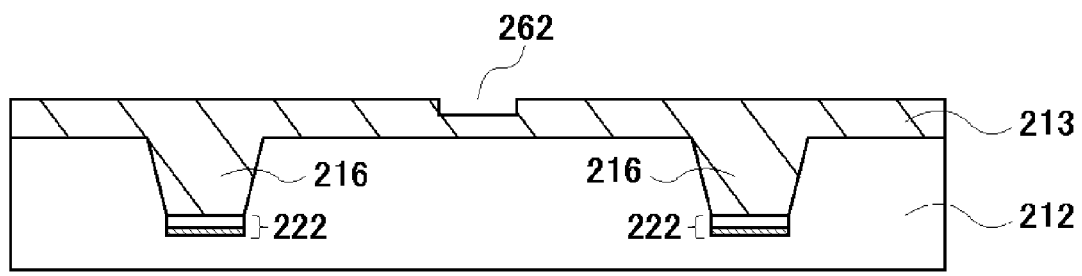
FIGS. 14A and 14B are cross-sectional views showing a process in a method for exposing heads of bump electrodes.
Figure 14B:
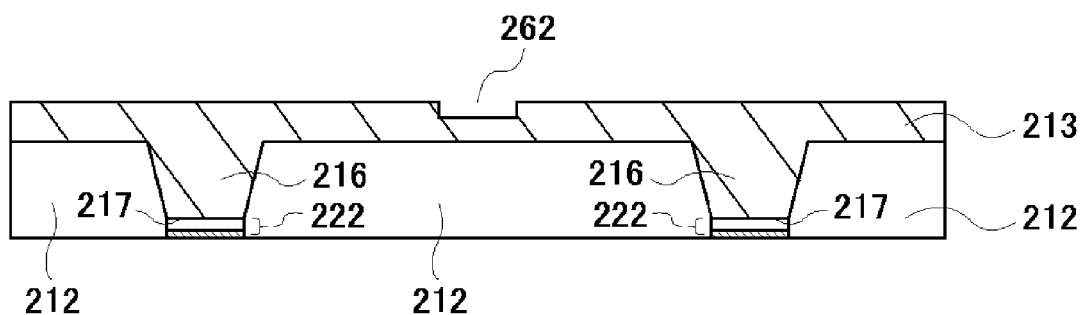
Figure 15A:
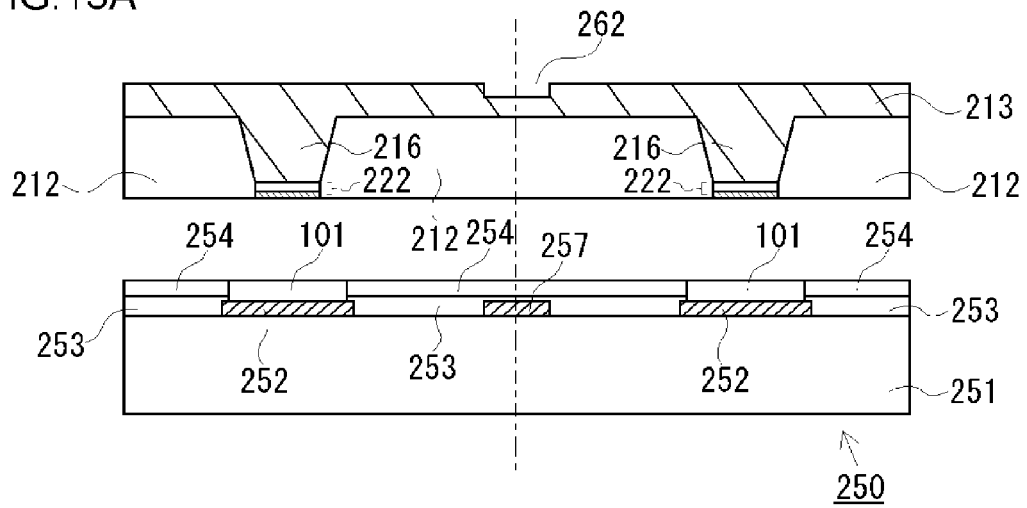
FIGS. 15A to 15C are cross-sectional views showing a process in a method for pasting together a semiconductor device and a board (device mounting board) on which the semiconductor device and bump electrodes are provided.
Figure 15B:
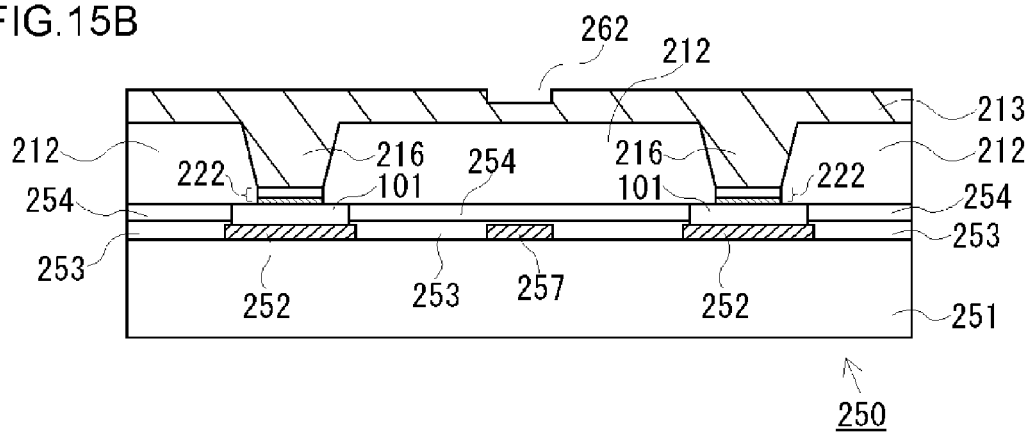
Figure 15C:
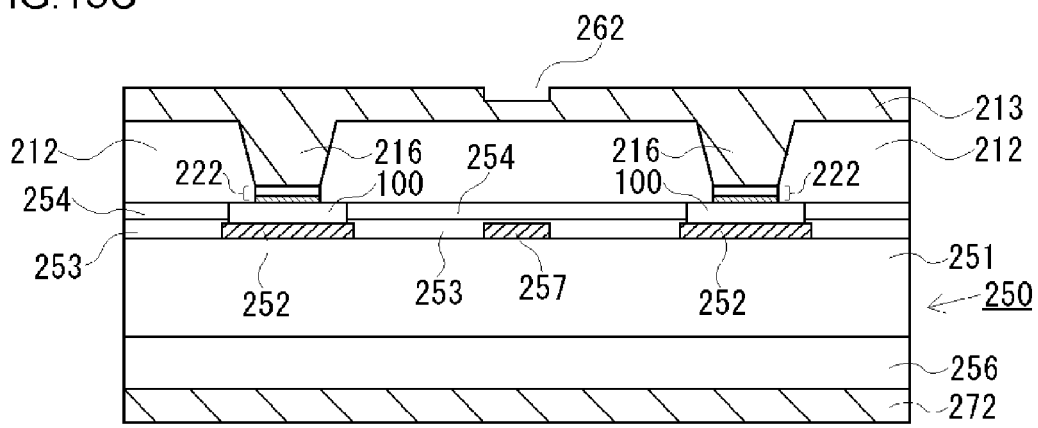
Figure 16A:
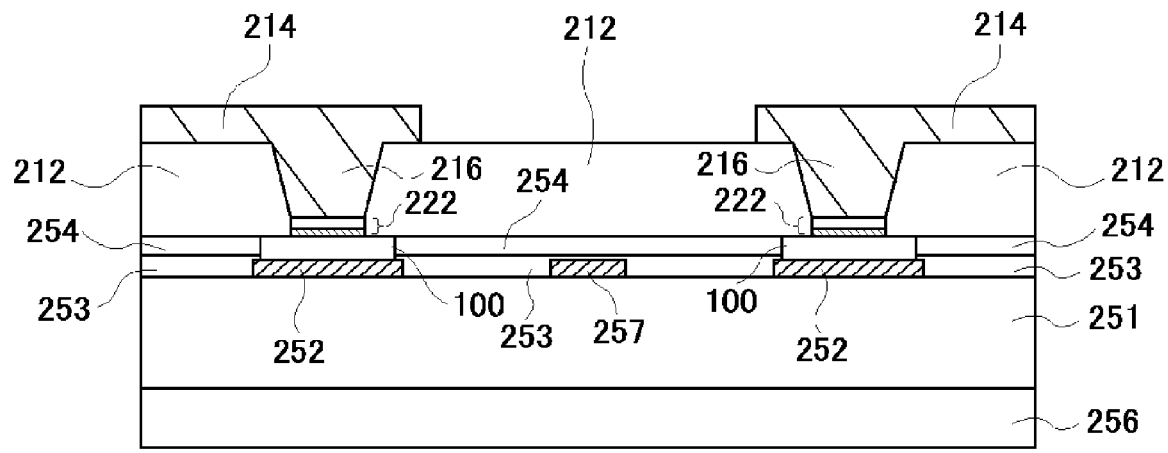
FIGS. 16A and 16B are cross-sectional views showing a rewiring process.
Figure 16B:
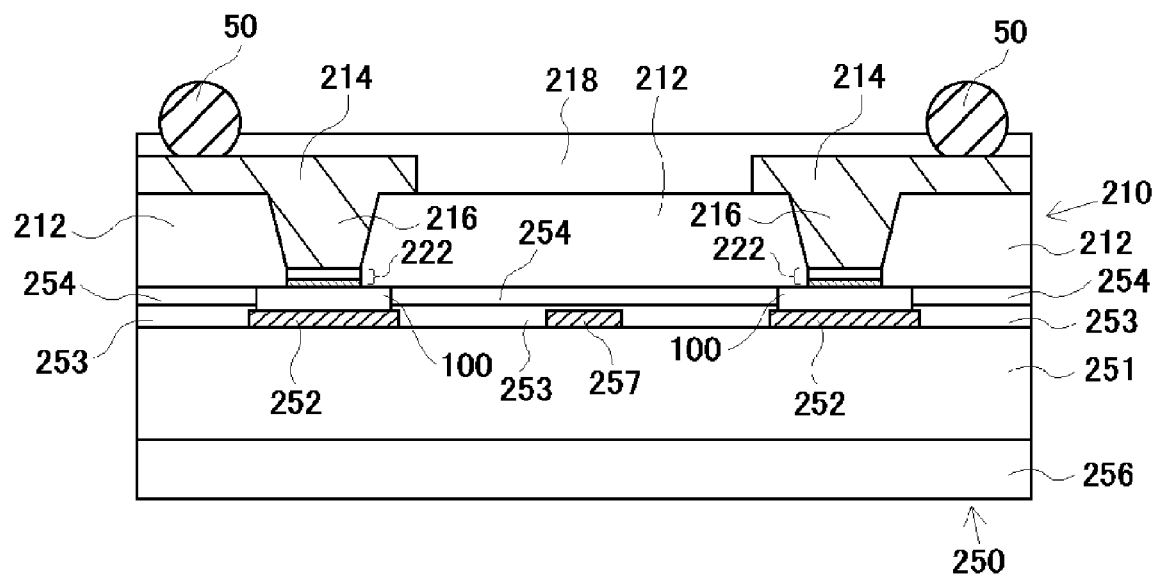
Figure 17:
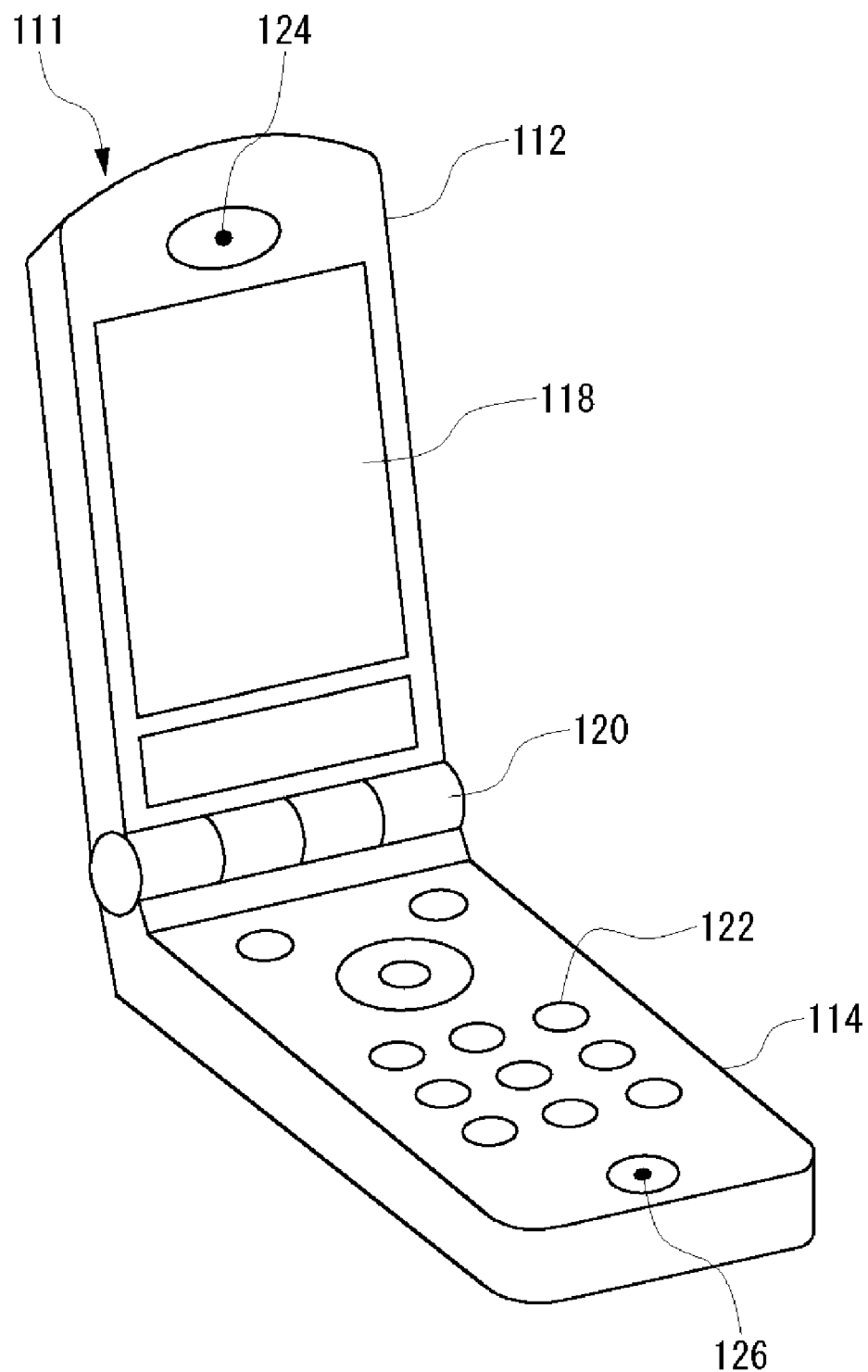
FIG. 17 illustrates a structure of a mobile phone provided with a semiconductor module according to each of the embodiments.
Figure 18:
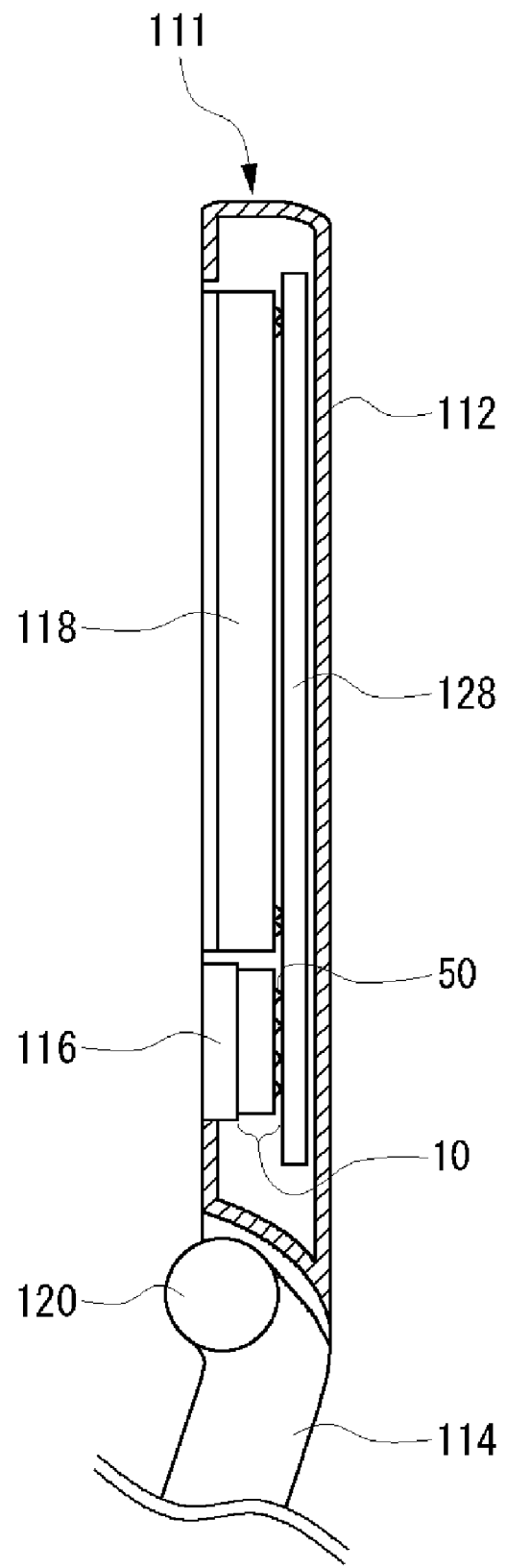
FIG. 18 is a partially schematic cross-sectional view of the mobile phone shown in FIG. 17.

| | |
|---|---|
| 2 | Solder structure |
| 4 | Sn alloy |
| 6 | Au coating |
| 8 | Au layer |
| 10 | Semiconductor module |
| 20 | Device mounting board |
| 30 | Semiconductor device |
| 40 | Passive device |
| 50 | Solder ball |

What is claimed is:

1. A solder structure occurring after melt and solidification, comprising:
    an Sn alloy capable of taking a solid-liquid coexistent state; and
    an Au or Au alloy coating that covers part of a surface of the Sn alloy, wherein the Au or Au alloy coating forms a netlike structure.

2. A semiconductor module, comprising:
    a wiring substrate;
    a semiconductor device mounted on said wiring substrate;
    an electrode disposed on said wiring substrate;
    an electronic component mounted on said wiring substrate; and
    the solder structure according to claim 1 for electrically connecting said electronic component to said electrode.

3. A semiconductor module, comprising:
    a device mounting board having an insulating layer, a wiring layer disposed on one of main surfaces of the insulating layer, and a bump electrode, electrically connected to the wiring layer, which protrudes from the wiring layer to an insulating layer side;
    a semiconductor device provided with a device electrode; and
    the solder structure according to claim 1, said solder structure electrically connecting said device electrode to the bump electrode.

4. The solder structure of claim 1, wherein in the netlike structure, plural openings are formed in the Au or Au alloy coating and the Sn alloy is exposed from the plural openings.

* * * * *